(12) United States Patent
Edahiro

(10) Patent No.: US 8,705,288 B2
(45) Date of Patent: Apr. 22, 2014

(54) NONVOLATILE SEMICONDUCTOR MEMORY WITH A SOURCE LINE POTENTIAL LEVEL DETECTION CIRCUIT

(75) Inventor: Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 260 days.

(21) Appl. No.: 13/227,671

(22) Filed: Sep. 8, 2011

(65) Prior Publication Data
US 2012/0063224 A1 Mar. 15, 2012

(30) Foreign Application Priority Data

Sep. 10, 2010 (JP) ................................. 2010-203727

(51) Int. Cl.
- *G11C 16/06* (2006.01)
- *G11C 16/24* (2006.01)
- *G11C 16/12* (2006.01)
- *G11C 16/10* (2006.01)
- *G11C 16/32* (2006.01)

(52) U.S. Cl.
USPC ............ 365/185.25; 365/185.08; 365/185.03; 365/185.24; 365/185.17

(58) Field of Classification Search
CPC .... G11C 16/0483; G11C 16/06; G11C 16/10; G11C 16/12; G11C 16/34
USPC ............. 365/185.08, 185.24, 185.25, 185.17, 365/185.22, 185.03
See application file for complete search history.

(56) References Cited

U.S. PATENT DOCUMENTS

| | | | |
|---|---|---|---|
| 6,064,611 A | 5/2000 | Tanaka et al. | |
| 6,208,573 B1 | 3/2001 | Tanaka et al. | |
| 6,344,996 B2 | 2/2002 | Tanaka et al. | |
| 6,525,964 B2 | 2/2003 | Tanaka et al. | |
| 6,621,738 B2 | 9/2003 | Tanaka et al. | |
| 6,868,013 B2 | 3/2005 | Tanaka et al. | |
| 7,061,807 B2 | 6/2006 | Tanaka et al. | |
| 7,349,259 B2 | 3/2008 | Tanaka et al. | |
| 7,535,762 B2 | 5/2009 | Tanaka et al. | |
| 7,649,780 B2 | 1/2010 | Tanaka et al. | |
| 7,719,891 B2 * | 5/2010 | Lim | 365/185.09 |
| 7,782,679 B2 * | 8/2010 | Yun | 365/185.21 |
| 8,264,888 B2 * | 9/2012 | Choi et al. | 365/185.25 |
| 2010/0315878 A1 | 12/2010 | Edahiro | |

FOREIGN PATENT DOCUMENTS

JP 10-283788 10/1998

* cited by examiner

*Primary Examiner* — J. H. Hur
(74) *Attorney, Agent, or Firm* — Oblon, Spivak, McClelland, Maier & Neustadt, L.L.P.

(57) ABSTRACT

According to one embodiment, a nonvolatile semiconductor memory includes a source line connected to first and second cell units, a cell-source driver setting the source line on a fixed potential in a programming, a data latch circuit temporary storing program data, a hookup circuit connecting one of the first and second bit lines to the data latch circuit, and connecting the other one of the first and second bit lines to the source line, in the programming, a level detection circuit detecting a potential level of the source line, and a control circuit determining a completion of a charge of the first and second bit lines when the potential level of the source line is larger than a threshold value, and making a charge time of the first and second bit lines variable, in the programming.

11 Claims, 13 Drawing Sheets

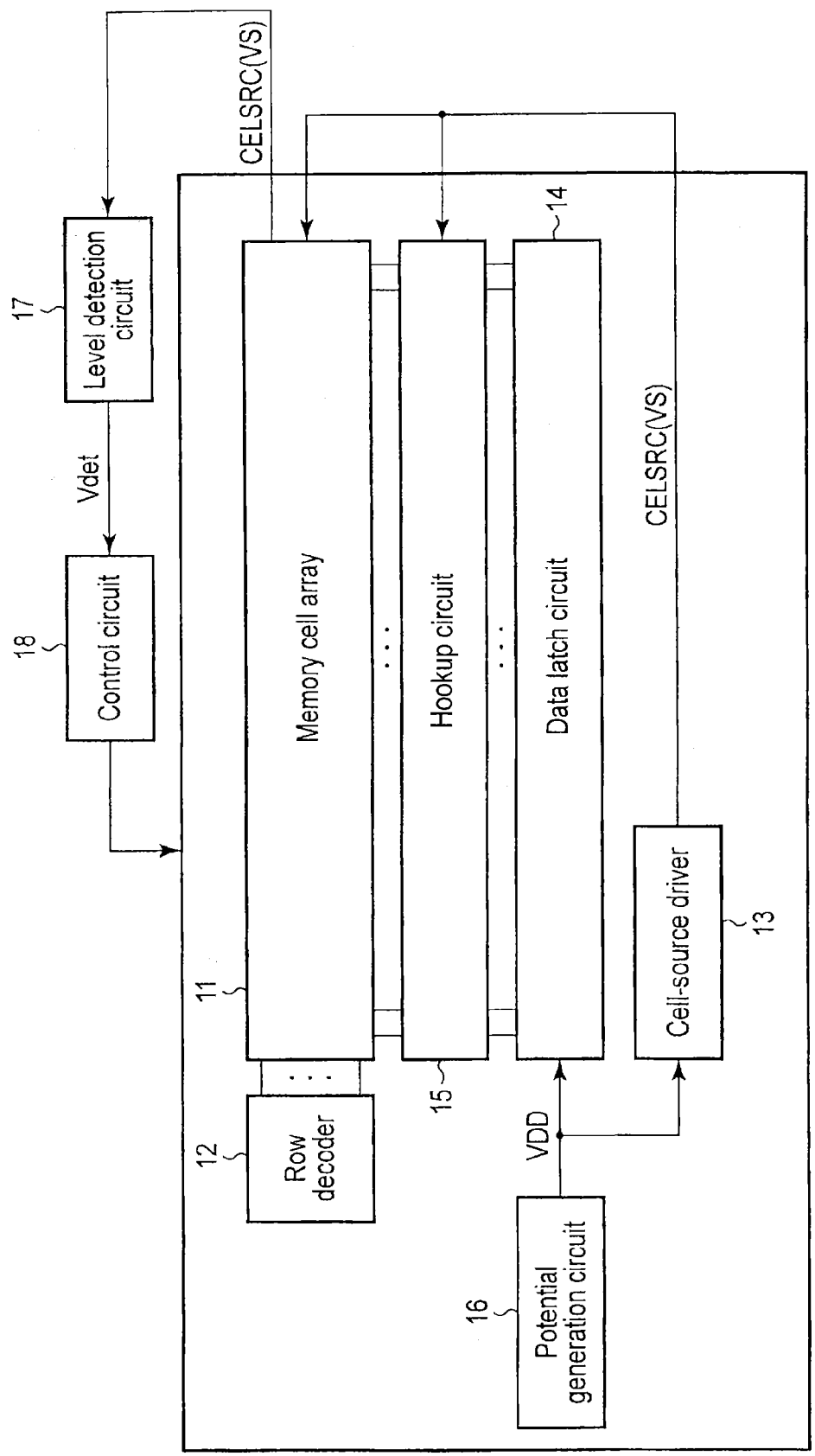
F I G. 1

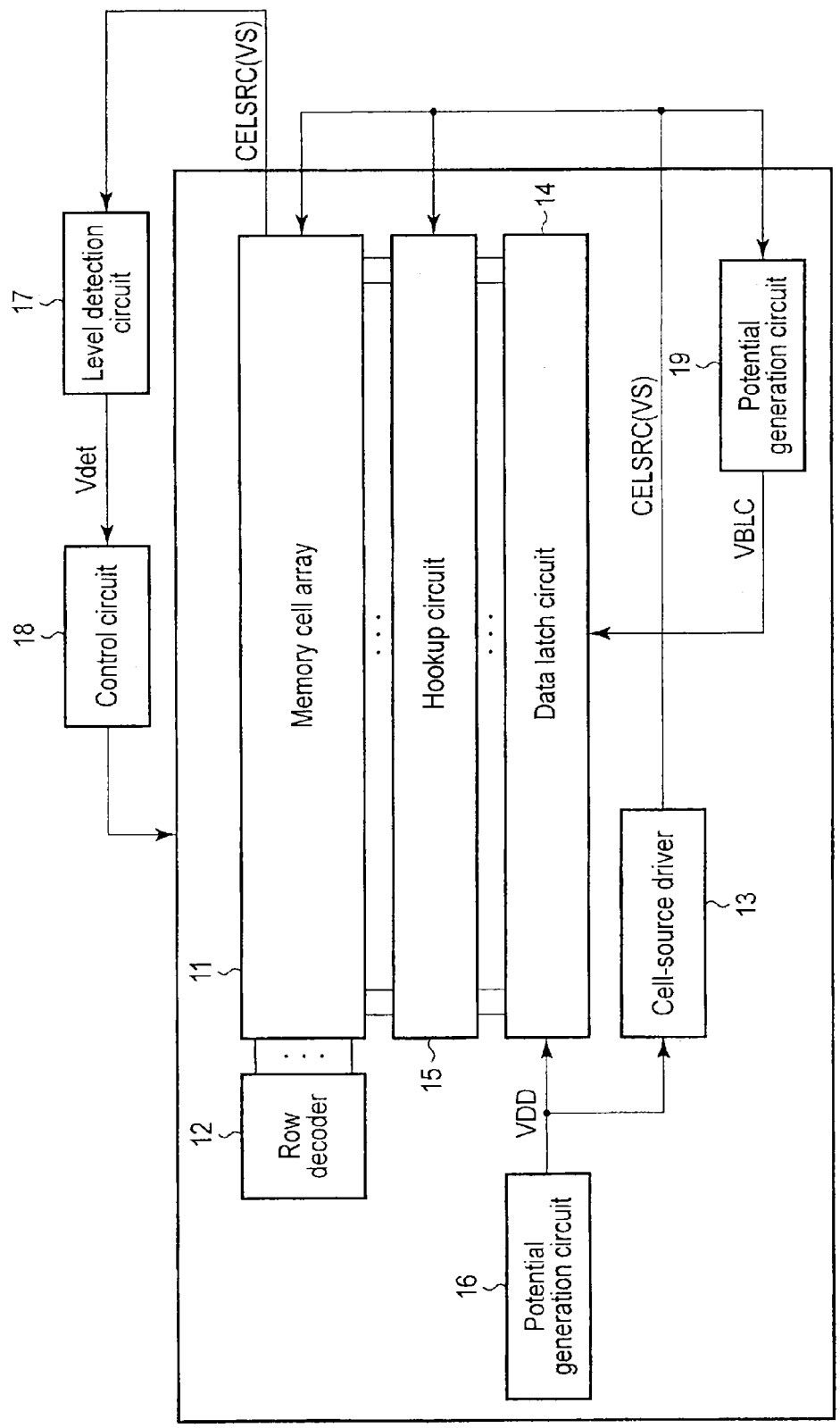
F I G. 2

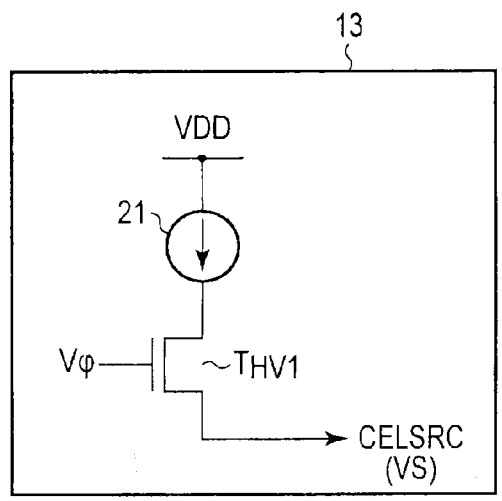
F I G. 5
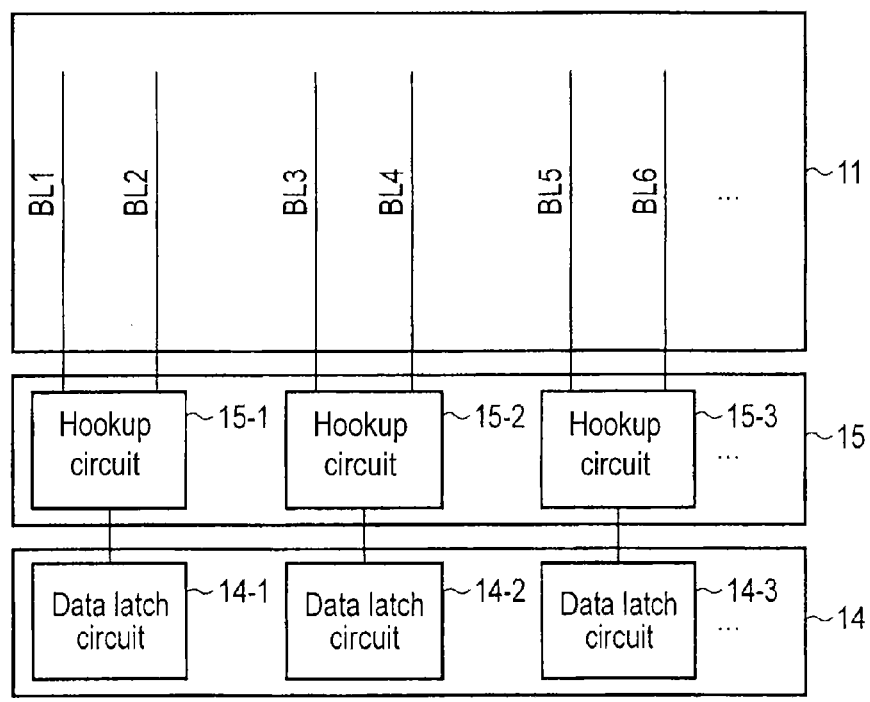
F I G. 6

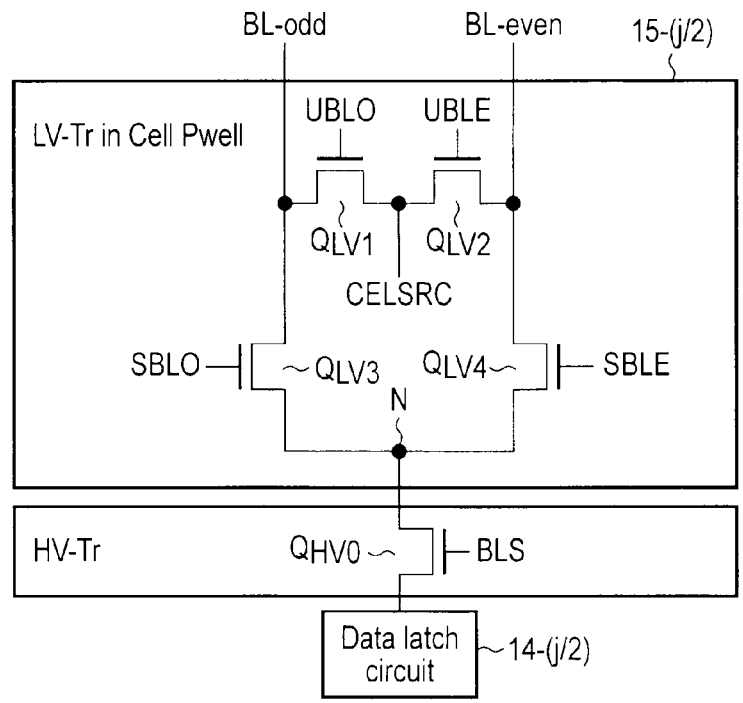
F I G. 7
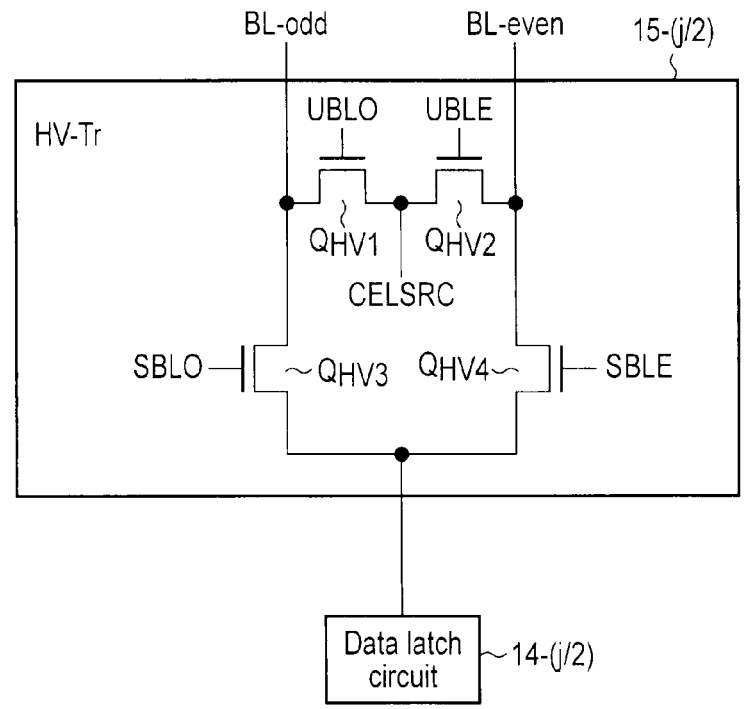
F I G. 8

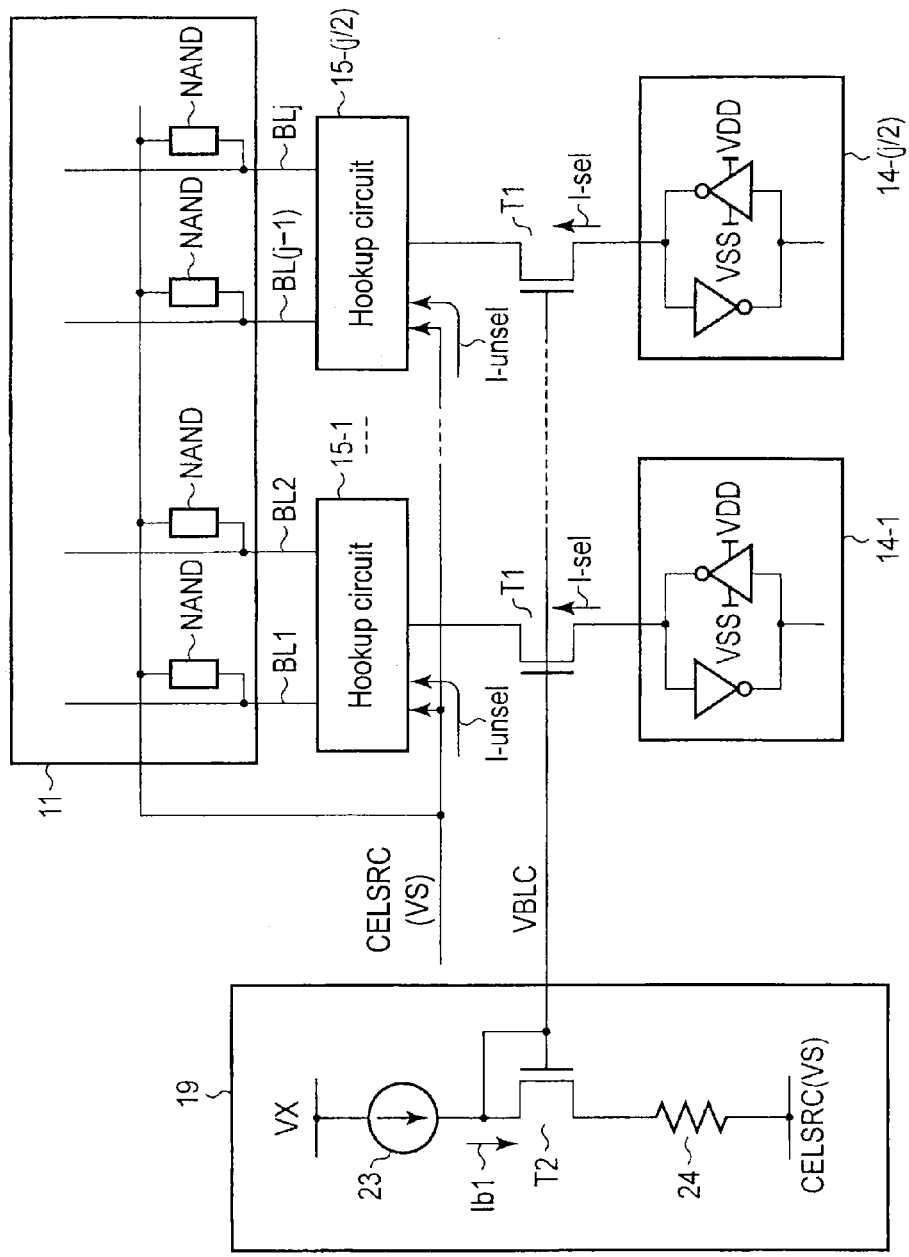
F I G. 12

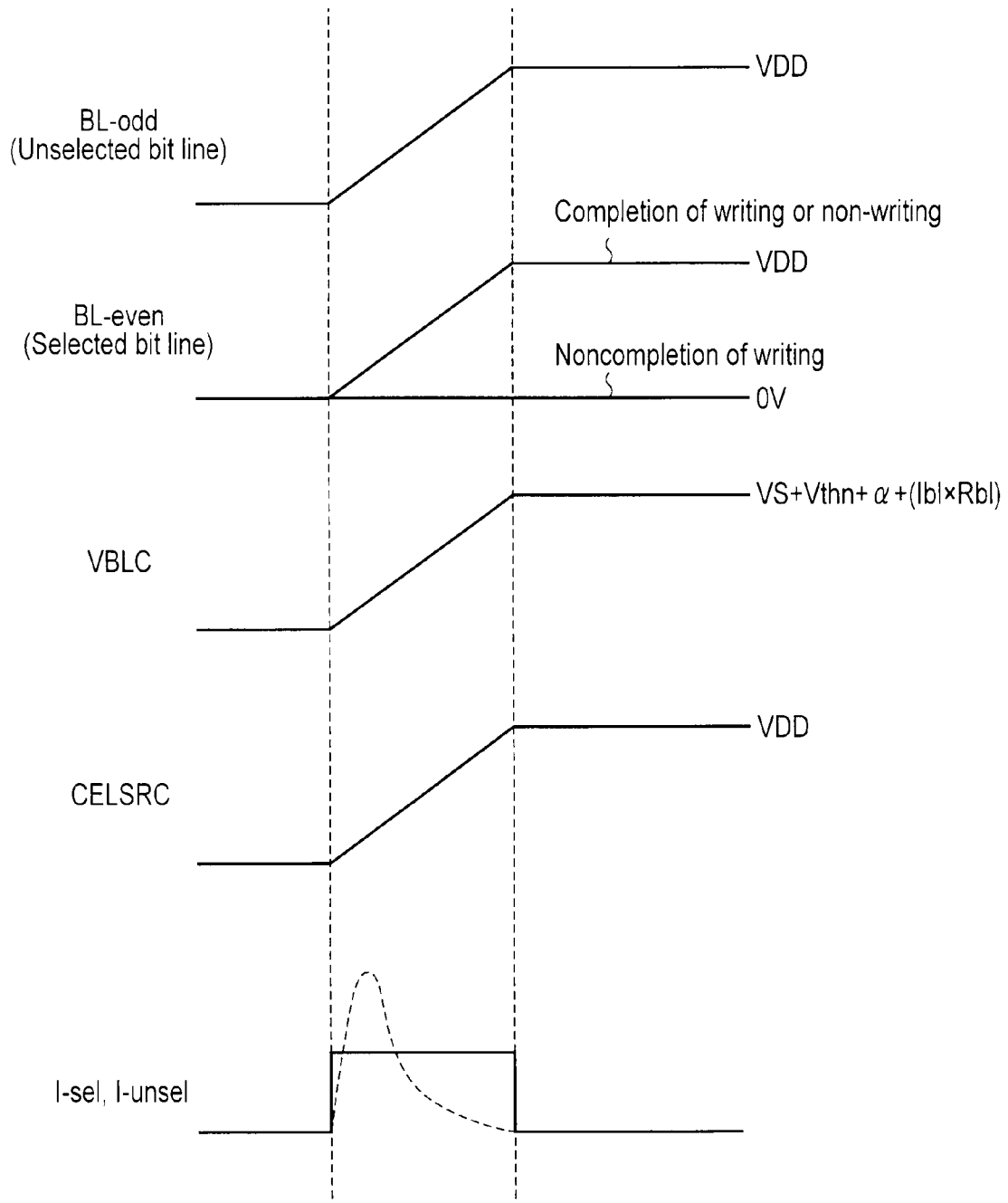
F I G. 13

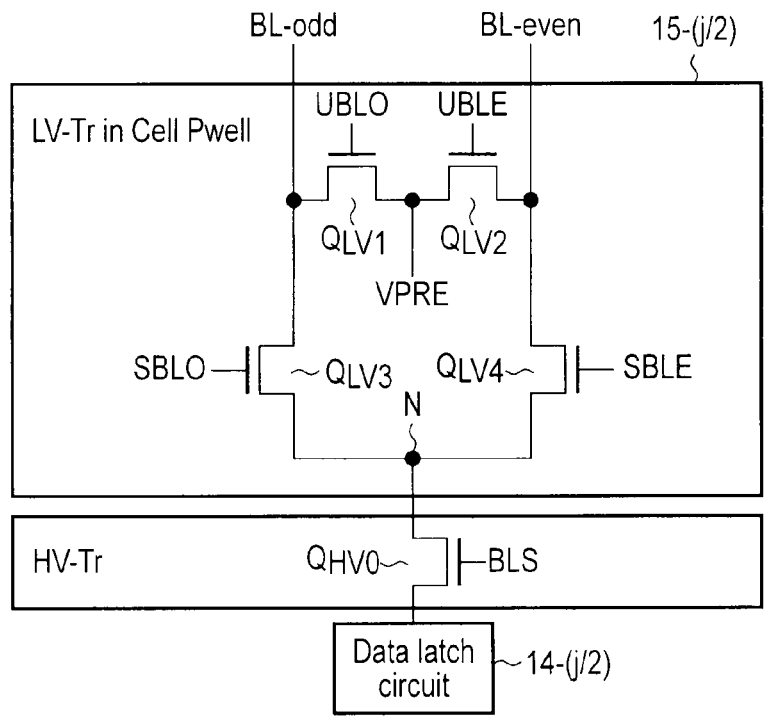
F I G. 16
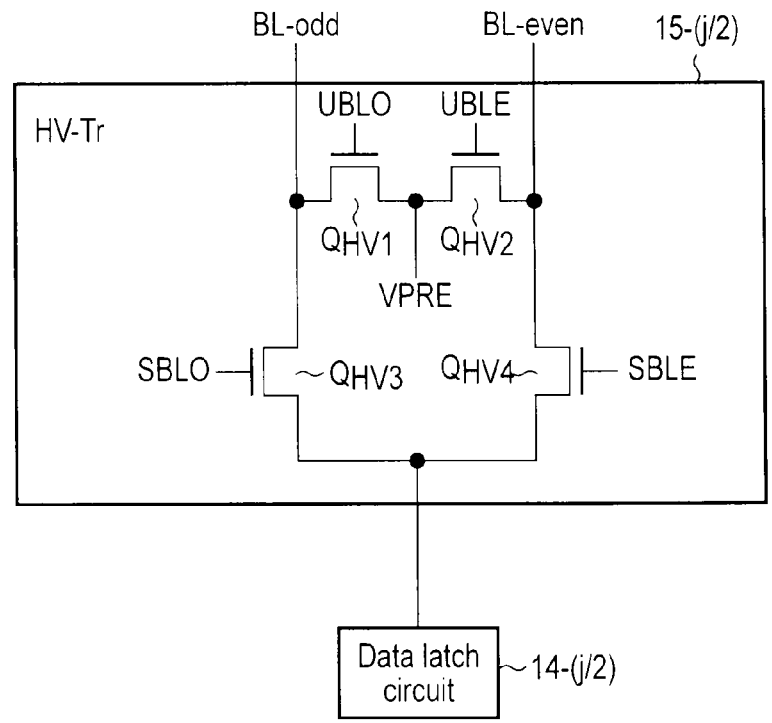
F I G. 17

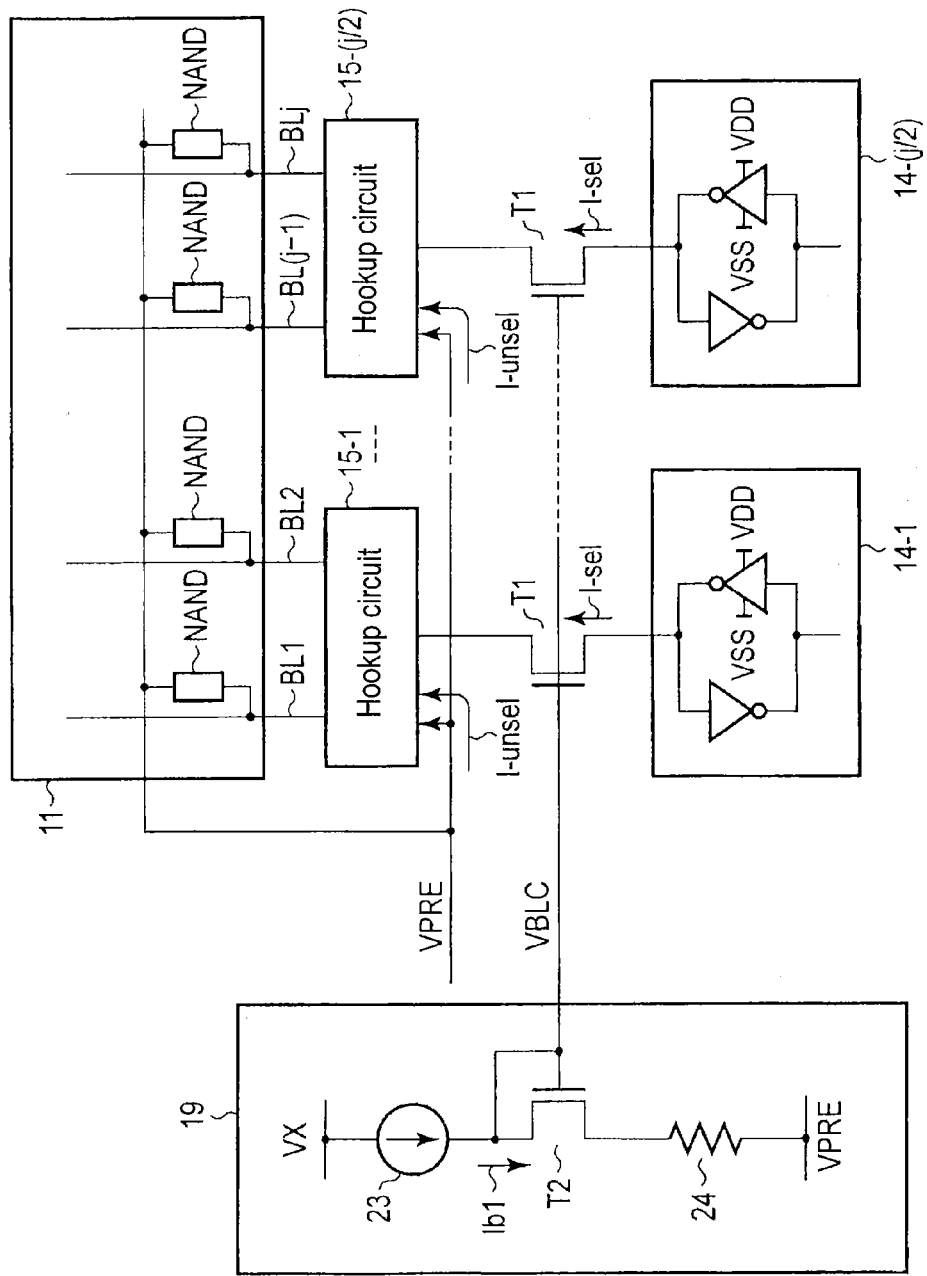
F I G. 19

NONVOLATILE SEMICONDUCTOR MEMORY WITH A SOURCE LINE POTENTIAL LEVEL DETECTION CIRCUIT

CROSS-REFERENCE TO RELATED APPLICATIONS

This application is based upon and claims the benefit of priority from prior Japanese Patent Application No. 2010-203727, filed Sep. 10, 2010, the entire contents of which are incorporated herein by reference.

FIELD

Embodiments described herein relate generally to a nonvolatile semiconductor memory.

BACKGROUND

Programming of a nonvolatile semiconductor memory (for example, a NAND flash memory) is performed for each page. As the capacity of recent nonvolatile semiconductor memories increases, page size becomes larger, and it becomes necessary to simultaneously charge a large number of bit lines in programming, thereby generating a peak current. That is, the peak current generates noise, and also causes a malfunction due to a low power supply potential or lowers the reliability.

To improve the performance of a memory system which controls chips (nonvolatile semiconductor memories) by a controller, it is necessary to reduce the power consumption of the nonvolatile semiconductor memories. Specifically, when a programming is simultaneously performed for chips to increase the speed of the programming, large power consumption is required to charge bit lines within one chip, resulting in very large power consumption in the whole system. Decreasing such power consumption is needed.

BRIEF DESCRIPTION OF THE DRAWINGS

FIGS. 1 and 2 are block diagrams each showing a nonvolatile semiconductor memory;
FIG. 4 is a view showing bit assignment of a four-level memory;
FIG. 5 is a circuit diagram showing a cell-source driver;
FIG. 6 is a block diagram for explaining a programming method;
FIGS. 7 and 8 are circuit diagrams each showing a hookup circuit;
FIG. 12 is a circuit diagram showing a potential generation circuit;
FIG. 13 is a chart for explaining the effect of the potential generation circuit of FIG. 12;
FIGS. 16 and 17 are circuit diagrams each showing a hookup circuit;
FIG. 19 is a circuit diagram showing a potential generation circuit.

DETAILED DESCRIPTION

In general, according to one embodiment, a nonvolatile semiconductor memory comprising: a first cell unit including a first memory cell; a second cell unit including a second memory cell; a first bit line connected to one end of the first cell unit; a second bit line connected to one end of the second cell unit; a source line connected to the other ends of the first and second cell units; a cell-source driver setting the source line on a fixed potential in a programming; a data latch circuit temporary storing program data; a hookup circuit connecting one of the first and second bit lines to the data latch circuit, and connecting the other one of the first and second bit lines to the source line, in the programming; a level detection circuit detecting a potential level of the source line; and a control circuit determining a completion of a charge of the first and second bit lines when the potential level of the source line is larger than a threshold value, and making a charge time of the first and second bit lines variable, in the programming.

FIGS. 1 and 2 are block diagrams each showing a nonvolatile semiconductor memory according to the embodiment.

Memory cell array 11 comprises the first cell unit including the first memory cell, the second cell unit including the second memory cell, the first bit line connected to one end of the first cell unit, the second bit line connected to one end of the second cell unit, and a source line connected to the other ends of the first and second cell units.

Figure 3:
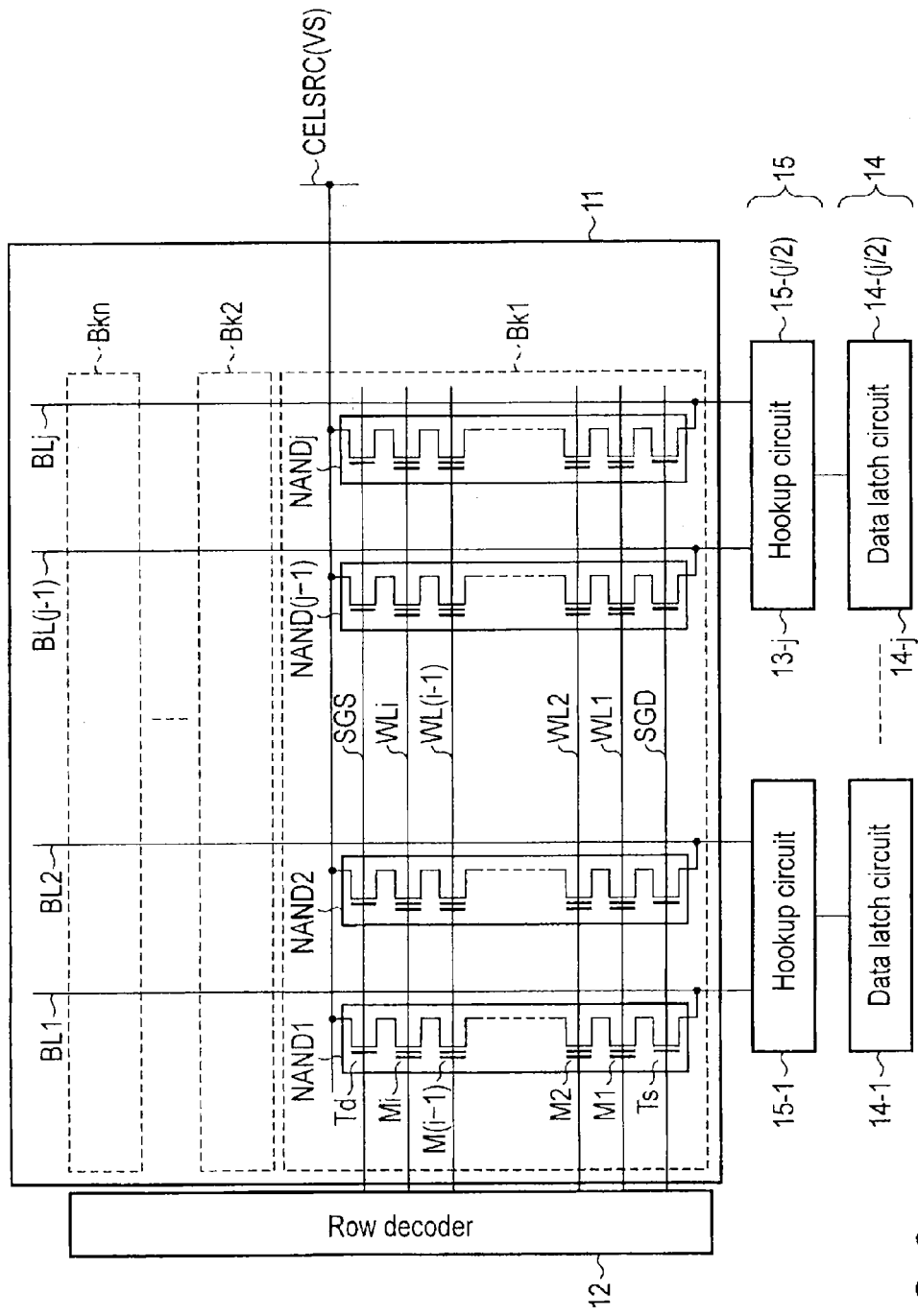
FIG. 3 is a circuit diagram showing a memory cell array.

As shown in FIG. 3, for example, in a NAND flash memory, memory cell array 11 has n (n is a natural number of 2 or more) NAND blocks BK1, BK2, . . . , and BKn. Each NAND block has j (j is an even number of 2 or more) NAND cell units NAND1, NAND2, . . . , NAND(j−1), and NANDj.

Each NAND cell unit has i (i is a natural number of 2 or more) memory cells M1, M2, . . . , M(i−1), and Mi connected in series, and select gate transistors Ts and Td connected to the two ends of the series circuit of memory cells. One end of each NAND cell unit is connected to one of j bit lines BL1, BL2, . . . , BL(j−1), and BLj, and the other end of the NAND cell unit is connected to source line CELSRC.

Each of i memory cells M1, M2, . . . , M(i−1), and Mi includes a stacked-gate type field effect transistor (FET) having a charge accumulation layer and a control gate electrode. The control gate electrode of each memory cell is connected to one of i word lines WL1, WL2, . . . , WL(i−1), and WLi.

Each of select gate transistors Ts and Td may include the same stacked-gate type FET as those of i memory cells M1, M2, . . . , M(i−1), and Mi, or may include a different FET. The gate electrode of source-side select gate transistor Ts is connected to source-side select gate line SGS. The gate electrode of drain-side select gate transistor Td is connected to drain-side select gate line SGD.

Row decoder 12 selects one of n NAND blocks BK1, BK2, . . . , and BKn within memory cell array 11 in a programming. Row decoder 12 also selects one of i word lines WL1, WL2, . . . , WL(i−1), and WLi within the selected NAND block in a programming.

A page as a unit of a programming will now be explained.

The embodiment adopts a method of separately performing a programming of odd-numbered bit lines BL-odd (BL1, BL3, . . . , BL(j−1)) and that of even-numbered bit lines BL-even (BL2, BL4, . . . , BLj).

In this case, (j/2) memory cells which are connected between one word line and odd-numbered bit lines BL-odd form one page. Similarly, (j/2) memory cells which are connected between one word line and even-numbered bit lines BL-even form one page.

The above description applies to a two-level memory for storing one bit (two values) in one memory cell. For example, as shown in FIG. 4, for a multi-level memory for storing two bits (four values) in one memory cell, (j/2) memory cells which are connected between one word line and odd-numbered bit lines BL-odd form two pages, and (j/2) memory cells which are connected between one word line and even-numbered bit lines BL-even form two pages.

Cell-source driver 13 generates a constant current for setting source line CELSRC on fixed potential VS in a programming. As shown in FIG. 5, for example, cell-source driver 13 includes constant current source 21, and high-voltage FET $T_{HV1}$ whose gate receives control signal Vφ.

Data latch circuit 14 temporarily stores program data. Data latch circuit 14 also functions as, for example, a sense amplifier.

Hookup circuit 15 transfers program data to one of the first and second bit lines in memory cell array 11 described above, and transfers a fixed potential to the other of the first and second bit lines. That is, hookup circuit 15 functions as a multiplexer.

As described above, the embodiment adopts a method of separately performing a programming of odd-numbered bit lines BL-odd (BL1, BL3, . . . , BL(j−1)) and that of even-numbered bit lines BL-even (BL2, BL4, . . . , BLj).

In this case, for example, as shown in FIGS. 3 and 6, there are provided one data latch circuit (sense amplifier) 14-(j/2) and one hookup circuit 15-(j/2) for two neighboring bit lines BL(j−1) and BLj.

For each hookup circuit, one of the following two types is used.

In one type of hookup circuit, FETs forming the circuit are low-voltage FETs which are provided in a well region (Cell Pwell) provided with memory cells. The data latch circuit and the hookup circuit each have a size larger than that of a low-voltage FET (LV-Tr), and are connected by a high-voltage FET (HV-Tr) with a high breakdown voltage.

As shown in FIG. 7, for example, hookup circuit 15-(j/2) includes low-voltage FETs $Q_{LV1}, \ldots, Q_{LV4}$.

FET $Q_{LV1}$ is connected between odd-numbered bit line BL-odd and source line CELSRC. FET $Q_{LV2}$ is connected between even-numbered bit line BL-even and source line CELSRC. For example, if control signal UBLO is high, source line CELSRC is electrically connected to odd-numbered bit line BL-odd. If a control signal UBLE is high, source line CELSRC is electrically connected to even-numbered bit line BL-even.

FET $Q_{LV3}$ is connected between odd-numbered bit line BL-odd and common node N. FET $Q_{LV4}$ is connected between even-numbered bit line BL-even and common node N. Common node N is connected to data latch circuit 14-(j/2) via high-voltage FET $Q_{HV0}$.

For example, if control signal SBLO is high, data latch circuit 14-(j/2) is electrically connected to odd-numbered bit line BL-odd. If control signal SBLE is high, data latch circuit 14-(j/2) is electrically connected to even-numbered bit line BL-even.

In the other type of hookup circuit, all FETs forming the circuit are of high-voltage type.

As shown in FIG. 8, for example, hookup circuit 15-(j/2) includes high-voltage FETs $Q_{HV1}, \ldots, Q_{HV4}$.

FET $Q_{HV1}$ is connected between odd-numbered bit line BL-odd and source line CELSRC. FET $Q_{HV2}$ is connected between even-numbered bit line BL-even and source line CELSRC. For example, if control signal UBLO is high, source line CELSRC is electrically connected to odd-numbered bit line BL-odd. If control signal UBLE is high, source line CELSRC is electrically connected to even-numbered bit line BL-even.

FET $Q_{HV3}$ is connected between odd-numbered bit line BL-odd and common node N. FET $Q_{HV4}$ is connected between even-numbered bit line BL-even and common node N. Common node N is connected to data latch circuit 14-(j/2). For example, if control signal SBLO is high, data latch circuit 14-(j/2) is electrically connected to odd-numbered bit line BL-odd. If control signal SBLE is high, data latch circuit 14-(j/2) is electrically connected to even-numbered bit line BL-even.

As the former type of hookup circuit is formed by small-sized low-voltage FETs, it is possible to reduce the area of the hookup circuit and simplify the layout. The former type, therefore, is preferred as compared with the latter type in which the hookup circuit is formed by large-sized high-voltage FETs.

In the former type, however, a very high erase potential is applied to the well region (Cell Pwell) provided with memory cells in erasing data. Hence, in erasing data, for example, the nodes of all the low-voltage FETs in the hookup circuit are biased to an erase potential, thereby preventing voltage violation.

Potential generation circuit 16 generates power supply potential VDD, and supplies it to cell-source driver 13 and data latch circuit 14. Level detection circuit 17 detects the potential level of source line CELSRC.

Figure 9:
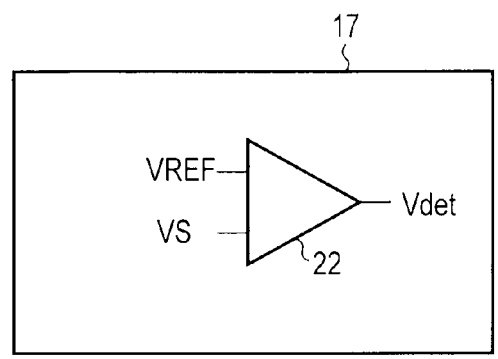
FIG. 9 is a circuit diagram showing a level detection circuit.

As shown in FIG. 9, for example, level detection circuit 17 includes comparator 22 for comparing fixed potential VS with reference potential VREF. That is, when the potential level of source line CELSRC is larger than reference potential (threshold) VREF, detection signal Vdet (for example, high) is output.

In a programming, when the potential level of source line CELSRC is larger than reference potential (threshold) VREF, control circuit 18 determines a completion of a charge of all the bit lines in memory cell array 11.

The bit lines are charged by, for example, a constant current. This is done for suppressing a peak current generated in a programming.

The timing when level detection circuit 17 outputs detection signal Vdet (for example, high), that is, the timing when a charge of all the bit lines is completed depends on the parasitic capacitance in memory cell array 11 in charging the bit lines.

Figure 10:
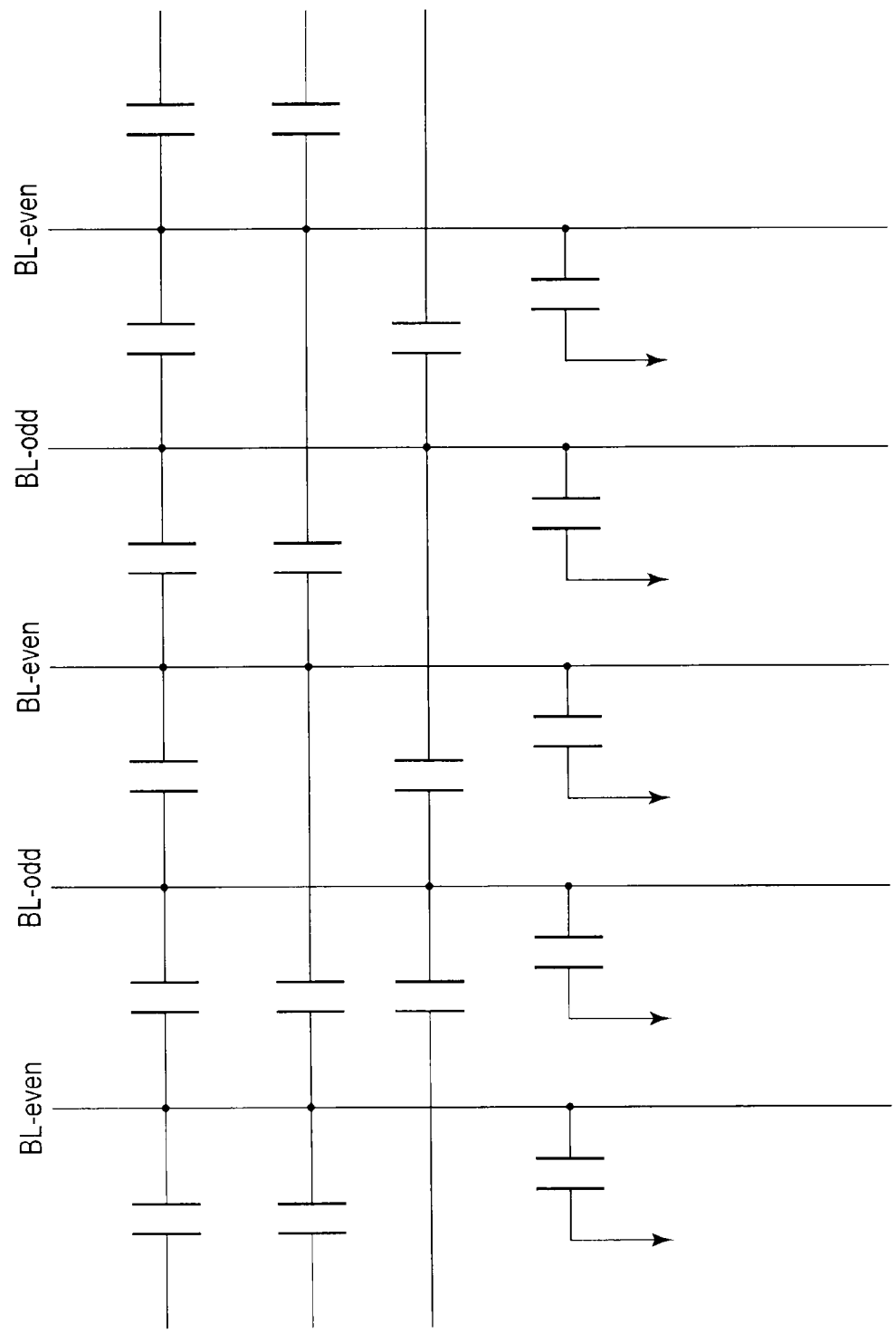
FIG. 10 is a view showing parasitic capacitances generated on bit lines.

As shown in FIG. 10, for example, there is a parasitic capacitance between bit lines BL-odd and BL-even, and it accounts for about 80% of the capacitance of a bit line generated between two neighboring bit lines.

A programming is performed by several write operations.

In the initial stage of a programming (in a stage in which the number of write operations is small), the number of selected memory cells in which a write is incomplete (memory cells to undergo a write operation) is large. Since the bit lines of selected memory cells are biased to, for example, ground potential VSS, a period of time for charging the bit lines of unselected memory cells (memory cells not to undergo a write operation) to power supply potential VDD becomes longer due to capacitive coupling with the bit lines of the selected memory cells.

On the contrary, in the final stage (in a stage in which the number of write operations is large) of the programming, most of the selected memory cells are in a write completion state. Since the bit lines of the selected memory cells in which a write is completed are biased to, for example, power supply potential VDD, a period of time for charging the bit lines of the unselected memory cells to power supply potential VDD becomes shorter due to capacitive coupling with the bit lines of the selected memory cells.

That is, in the initial stage of a programming, a total charge amount necessary for charging all the bit lines is large. In the final stage of the programming, a total charge amount necessary for charging all the bit lines is small. Let $C_{BL}$ be the capacitance of one bit line; tn, the number of bit lines; and n, the number of selected memory cells (memory cells whose bit lines are biased to ground potential VSS when a write is incomplete). Then, $(C_{BL}×0.8×n)+(C_{BL}×0.2×tn)$ represents the total charge amount.

Figure 11:
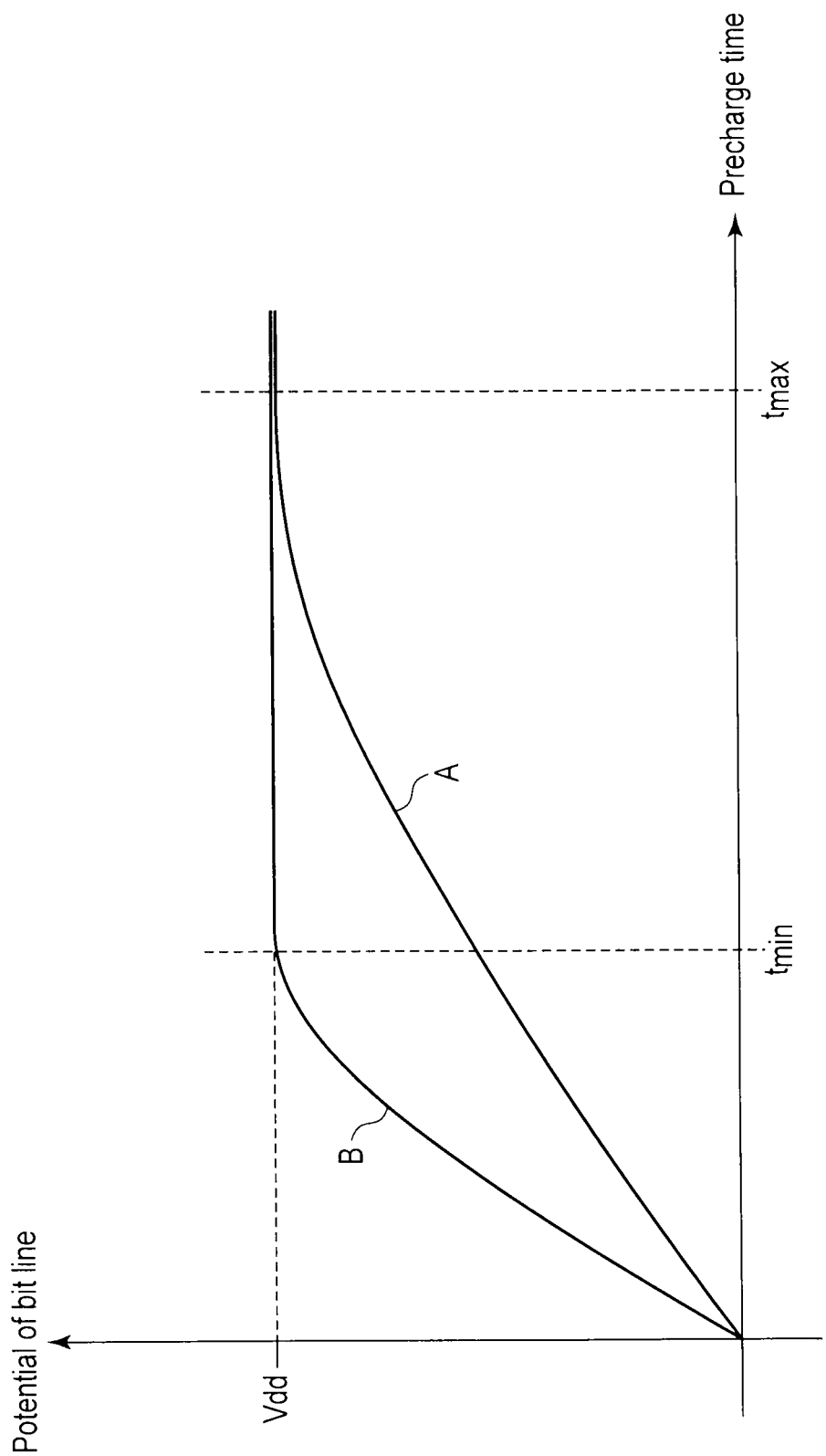
FIG. 11 is a timing chart showing a variation in charge time of bit lines.

As described above, when charging all the bit lines by a constant current, as shown in FIG. 11, for example, if a necessary total charge amount is large, the gradient of a variation in potential until all the bit lines are charged to a predetermined potential (for example, power supply potential VDD) is small (waveform A), thereby prolonging charge time tmax. On the contrary, if a necessary total charge amount is small, the gradient of a variation in potential until all the bit lines are charged to a predetermined potential (for example, power supply potential VDD) is large (waveform B), thereby shortening charge time tmin.

It is very difficult to directly detect the potential level of the bit lines. As in the embodiment, however, it is possible to detect the potential level of source line CELSRC using level detection circuit 17, thereby enabling to indirectly detect the potential level of unselected bit lines connected with unselected memory cells.

In a programming, when the potential level of source line CELSRC is larger than reference potential (threshold) VREF, control circuit 18 determines a completion of a charge of all the bit lines in memory cell array 11, and also makes a charge time variable based on the determination result.

In a conventional technique, the charge time of the bit lines is fixed. The charge time is set to, for example, tmax in FIG. 11 in the worst case. In this case, even in the final stage of a programming, charge time tmax is applied, thereby prolonging the programming time.

According to the embodiment, a charge time is set to tmax in FIG. 11 in the initial stage of a programming, and is automatically set to tmin in FIG. 11 in the final stage of the programming. It is, therefore, possible to shorten the programming time, and suppress power consumption in the programming.

Selected bit lines (odd-numbered bit lines BL-odd or even-numbered bit lines BL-even) connected with selected memory cells are charged to a programming potential (ground potential VSS when a write is incomplete or power supply potential VDD when a write is completed) from data latch circuit 14.

A write operation indicates an operation of increasing a cell threshold (for example, 0-programming). An unwritten operation indicates an operation of maintaining a cell threshold constant (for example, 1-programming).

On the contrary, unselected bit lines (odd-numbered bit lines BL-odd or even-numbered bit lines BL-even) connected with unselected memory cells are charged to power supply potential VDD from source line CELSRC.

That is, a charge of the selected bit lines is independent of a charge of the unselected bit lines.

To associate a charge of the selected bit lines with that of the unselected bit lines, there is provided potential generation circuit 19.

As shown in FIG. 12, for example, potential generation circuit 19 generates potential VBLC, and applies it to the gate of first FET T1 connected between data latch circuit 14-(j/2) and hookup circuit 15-(j/2).

Potential generation circuit 19 includes second FET T2 whose gate and drain are connected with the gate of first FET T1, constant current source 23 connected between power supply node VX and the drain of second FET T2, and resistance element 24 connected between the source of second FET T2 and source line CELSRC.

Using potential generation circuit 19, it is possible to associate a charge of the selected bit lines with that of the unselected bit lines by changing gate potential VBLC of first FET T1 and second FET T2 according to the potential level of source line CELSRC. Note that the sizes of first FET T1 and second FET T2 are preferably equal to each other.

Gate potential VBLC of first FET T1 and second FET T2 is represented by $VS+Vthn+\alpha+(Ibl×Rbl)$ where VS indicates the potential of source line CELSRC, Vthn indicates a threshold voltage of second FET T2, $\alpha$ indicates the back bias effect of second FET T2, Ibl indicates a constant current, and Rbl indicates the resistance value of resistance element 24.

By associating a charge of the selected bit lines with that of the unselected bit lines using potential generation circuit 19, it is possible to obtain an effect of suppressing a peak current due to a constant current, and also shorten the charge time to decrease the programming time.

This will be explained using a waveform chart in FIG. 13.

The unselected bit line (in this example, BL-odd) is charged to power supply potential VDD by, for example, constant current I-unsel from source line CELSRC. The selected bit line (in this example, BL-even) connected with memory cell in which a write is completed or incomplete is charged to power supply potential VDD by, for example, constant current I-sel from the data latch circuit.

Since the potential level of the selected bit line by constant current I-sel is based on gate potential VBLC depending on the potential level of source line CELSRC, it is possible to synchronize an increase in potential of the selected bit line with an increase in potential of source line CELSRC (an increase in potential of the unselected bit line). That is, the potentials of the unselected bit line and selected bit line increase with the same gradient in the same way.

As described above, since the potentials of the unselected bit line and selected bit line increase with the same gradient during the same period of time in a programming, the influence of capacitive coupling generated between the unselected bit line and the selected bit line decreases, thereby shortening the charge time.

In FIG. 13, a broken line in the waveforms of currents I-sel and I-unsel represents a peak current generated when a charge of the selected/unselected bit line is not executed by a constant current.

Finally, a programming operation of the above-described nonvolatile semiconductor memory will be described.

Assume that a programming of odd-numbered bit lines BL-odd is executed separately from that of even-numbered bit lines BL-even, and one memory cell stores one bit (two values).

Referring to FIG. 7, for example, low (for example, 0 V) is set to control signal UBLO; high (for example, 4 V), control signal UBLE; high (for example, 4 V), control signal SBLO; and low (for example, 0 V), control signal SBLE. At this time, FETs $Q_{LV1}$ and $Q_{LV4}$ are turned off, and FET $Q_{LV2}$ and $Q_{LV3}$ are turned on.

In this state, program data from data latch circuit 14-(j/2) is transferred to odd-numbered bit line BL-odd while fixed potential (for example, power supply potential) VDD from source line CELSRC is transferred to even-numbered bit line BL-even.

Program data is fixed potential (for example, power supply potential) VDD in a 1-write operation (a write operation of keeping an erase state), and is ground potential VSS in a 0-write operation (a write operation of increasing a threshold from an erase state to a write state).

As described above, for example, the charge time of bit lines BL-odd and BL-even varies depending on the number of write operations (a threshold state of the selected memory cells). In the embodiment, since it is possible to indirectly determine the potential levels of bit lines BL-odd and BL-even by detecting the potential level of source line CELSRC, it is possible to execute the next operation immediately after a charge of bit lines BL-odd and BL-even is completed. The charge time of bit lines BL-odd and BL-even is thus variable.

After that, programming potential Vpgm is applied to selected word lines and transfer potential Vpass is applied to unselected word lines.

At this time, a voltage relationship between memory cells (unselected memory cells) in which a write is not executed, memory cells (selected memory cells) in which a write is incomplete, and memory cells (selected memory cells) in which a write is completed is as follows.

The memory cells in which a write is not executed include memory cells connected to even-numbered bit lines BL-even, and 1-written memory cells, of the memory cells connected to odd-numbered bit lines BL-odd, which maintain an erase state.

In the memory cells in which a write is not executed, their channels have been charged to power supply potential VDD. That is, power supply potential VDD from source line CELSRC is transferred to the memory cells connected to even-numbered bit lines BL-even, while power supply potential VDD from data latch circuit 14-(j/2) is transferred to a corresponding one of the 1-written memory cells, of the memory cells connected to odd-numbered bit lines BL-odd, which maintain an erase state.

Therefore, in the memory cell in which a write is not executed, if programming potential Vpgm is applied to a selected word line, and transfer potential Vpass is applied to an unselected word line, the potential of the channel increases over power supply potential VDD due to capacitive coupling. Consequently, a bitline-side select gate transistor connected between the memory cell in which a write is not executed and bit lines BL-odd and BL-even is cut off.

In the memory cell in which a write is not executed, the channel floats, and its potential increases over power supply potential VDD. Therefore, in the memory cell in which a write is not executed, a high voltage necessary for a write operation is not generated between the channel and charge accumulation layer, and a write operation (increasing a threshold by injecting electrons into the charge accumulation layer) is prohibited.

The memory cells in which a write is incomplete/completed are, for example, 0-written memory cells, of the memory cells connected to odd-numbered bit lines BL-odd, which increase a threshold from an erase state to a write state.

In the memory cells in which a write is incomplete, their channels have been charged to ground potential VSS. That is, ground potential VSS from data latch circuit 14-(j/2) is transferred to a corresponding one of the 0-written memory cells, of the memory cells connected to odd-numbered bit lines BL-odd, which increase a threshold from an erase state to a write state.

Therefore, in a memory cell in which a write is incomplete, if programming potential Vpgm is applied to a selected word line and transfer potential Vpass is applied to an unselected word line, a high voltage necessary for a write operation is generated between the channel and charge accumulation layer, and a write operation (increasing a threshold by injecting electrons into the charge accumulation layer) is executed.

When the memory cell in a write noncompletion state changes its state to a write completion state by the above write operation, this change is stored in data latch circuit 14-(j/2).

That is, although data latch circuit 14-(j/2) corresponding to one of the memory cells in which a write is incomplete latches ground potential VSS (program data 0), it latches power supply potential VDD if a verify read operation indicates a completion of a write operation.

In the memory cells in which a write is completed, their channels are charged to power supply potential VDD from then on. That is, power supply potential VDD from data latch circuit 14-(j/2) is transferred to a corresponding one of the memory cells in which a write is completed, of the memory cells connected to odd-numbered bit lines BL-odd.

If, therefore, programming potential Vpgm is applied to the selected word line and transfer potential Vpass is applied to the unselected word line, the potential of the channel of the memory cell in which a write is completed increases over power supply potential VDD due to capacitive coupling. Consequently, a bitline-side select gate transistor connected between the memory cell in which a write is completed and odd-numbered bit line BL-odd is cut off.

In the memory cells in which a write is completed, the channels float, and their potential increases over power supply potential VDD. Therefore, in the memory cells in which a write is completed, a high voltage necessary for a write operation is not generated between the channels and charge accumulation layers, and a further write operation (increasing a threshold by injecting electrons into the charge accumulation layers) is prohibited.

As described above, using the nonvolatile semiconductor memory of the embodiment, it is possible to simultaneously suppress a peak current and power consumption in a programming.

Figure 14:
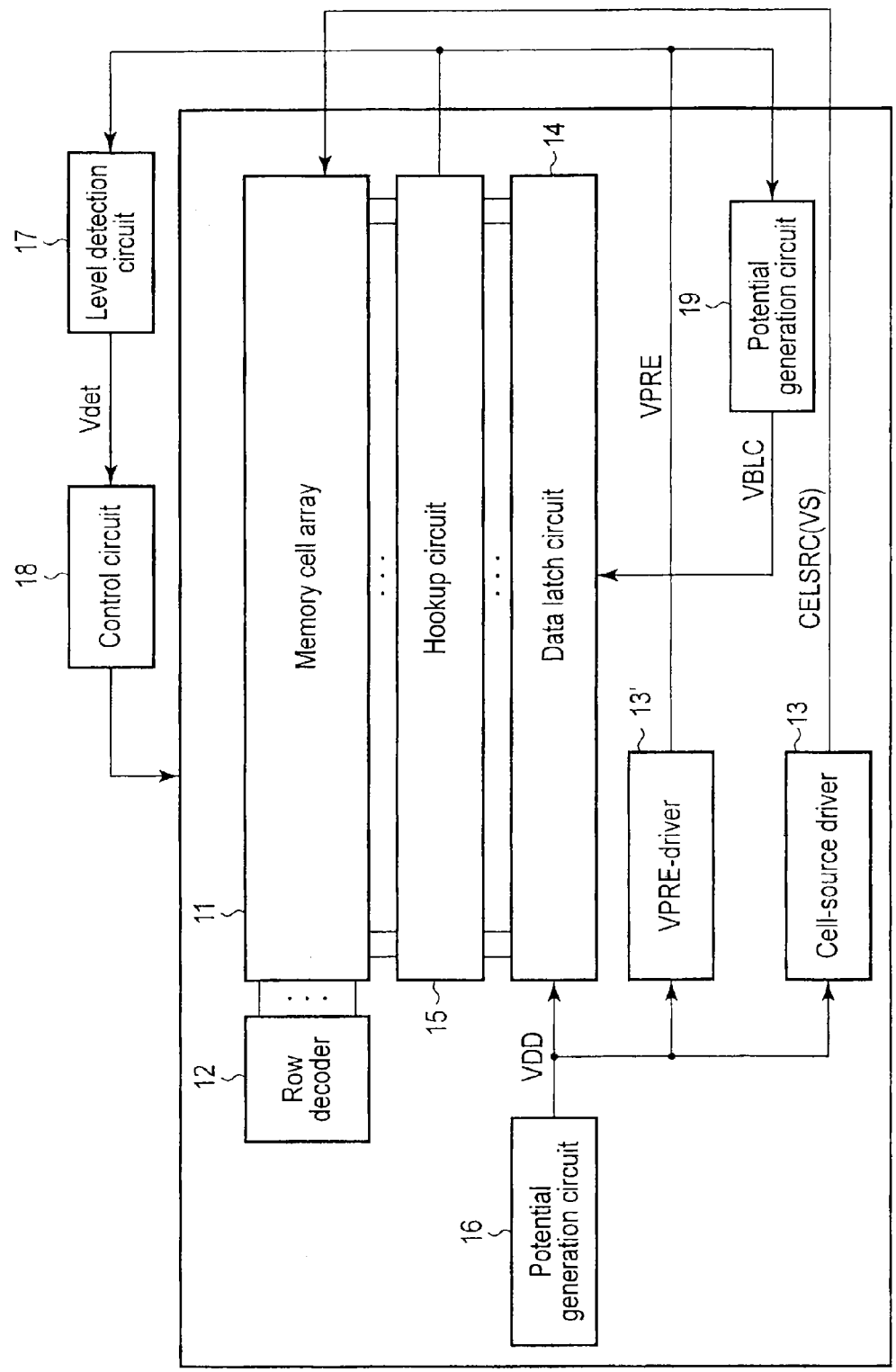
FIG. 14 is a block diagram showing a nonvolatile semiconductor memory.

FIG. 14 shows a nonvolatile semiconductor memory according to an embodiment.

This embodiment is characterized in that fixed potential (for example, power supply potential) VDD is not applied from source line CELSRC to an unselected bit line but an individual VPRE-driver applies fixed potential VPRE to charge the unselected bit line.

Memory cell array 11, row decoder 12, and cell-source driver 13 are the same as those of the nonvolatile semiconductor memory in FIGS. 1 and 2, and a description thereof will be omitted (see FIGS. 3, 4, and 5). In this embodiment, since VPRE-driver 13' is connected to hookup circuit 15, cell-source driver 13 is not connected to hookup circuit 15.

Figure 15:
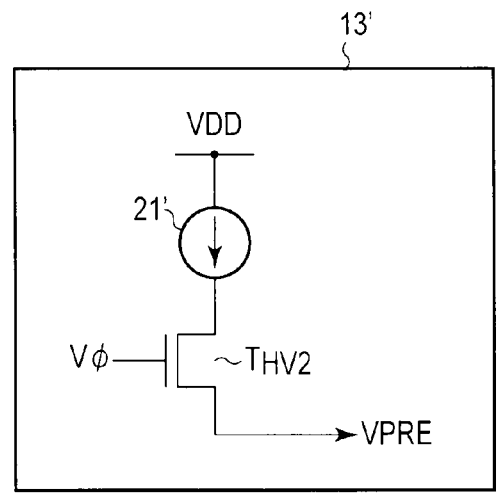
FIG. 15 is a circuit diagram showing a VPRE-driver.

In a programming, VPRE-driver 13' generates a constant current to set a bit line on fixed potential VPRE, and transfers the constant current to hookup circuit 15. As shown in FIG. 15, for example, VPRE-driver 13' includes constant current source 21' and high-voltage FET $T_{HV2}$ whose gate receives control signal Vϕ.

Data latch circuit 14 temporarily stores program data. Data latch circuit 14 also functions as, for example, a sense amplifier.

In a programming, hookup circuit 15 transfers program data to one of odd- and even-numbered bit lines, and transfers fixed potential VPRE to the other of odd- and even-numbered bit lines. That is, hookup circuit 15 functions as a multiplexer.

Hookup circuit 15 uses one of the two types as in the example of FIGS. 7 and 8.

As shown in FIG. 16, for example, hookup circuit 15-(j/2) includes low-voltage FETs $Q_{LV1}, \ldots, Q_{LV4}$.

FET $Q_{LV1}$ is connected between odd-numbered bit line BL-odd and fixed potential line VPRE. FET $Q_{LV2}$ is connected between even-numbered bit line BL-even and fixed potential line VPRE. For example, if control signal UBLO is high, fixed potential line VPRE is electrically connected to odd-numbered bit line BL-odd. If control signal UBLE is high, fixed potential line VPRE is electrically connected to even-numbered bit line BL-even.

FET $Q_{LV3}$ is connected between odd-numbered bit line BL-odd and common node N. FET $Q_{LV4}$ is connected between even-numbered bit line BL-even and common node N. Common node N is connected to data latch circuit 14-(j/2) via high-voltage FET $Q_{HV0}$.

For example, if control signal SBLO is high, data latch circuit 14-(j/2) is electrically connected to odd-numbered bit line BL-odd. If control signal SBLE is high, data latch circuit 14-(j/2) is electrically connected to even-numbered bit line BL-even.

As shown in FIG. 17, for example, hookup circuit 15-(j/2) includes high-voltage FETs $Q_{HV1}, \ldots, Q_{HV4}$.

FET $Q_{HV1}$ is connected between odd-numbered bit line BL-odd and fixed potential line VPRE. FET $Q_{HV2}$ is connected between even-numbered bit line BL-even and fixed potential line VPRE. For example, if control signal UBLO is high, fixed potential line VPRE is electrically connected to odd-numbered bit line BL-odd. If control signal UBLE is high, fixed potential line VPRE is electrically connected to even-numbered bit line BL-even.

FET $Q_{HV3}$ is connected between odd-numbered bit line BL-odd and common node N. FET $Q_{HV4}$ is connected between even-numbered bit line BL-even and common node N. Common node N is connected to data latch circuit 14-(j/2). For example, if control signal SBLO is high, data latch circuit 14-(j/2) is electrically connected to odd-numbered bit line BL-odd. If control signal SBLE is high, data latch circuit 14-(j/2) is electrically connected to even-numbered bit line BL-even.

Potential generation circuit 16 generates power supply potential VDD, and supplies it to cell-source driver 13, VPRE-driver 13', and data latch circuit 14. Level detection circuit 17 detects the potential level of fixed potential line VPRE.

Figure 18:
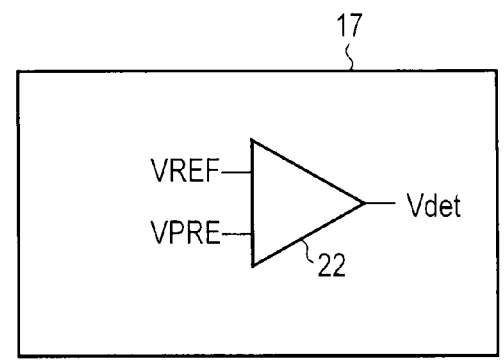
FIG. 18 is a circuit diagram showing a level detection circuit.

As shown in FIG. 18, for example, level detection circuit 17 includes comparator 22 for comparing fixed potential VPRE with reference potential VREF. That is, when the potential level of fixed potential line VPRE is larger than reference potential (threshold) VREF, detection signal Vdet (for example, high) is output.

In a programming, when the potential level of fixed potential line VPRE is larger than reference potential (threshold) VREF, control circuit 18 determines a completion of a charge of all bit lines in memory cell array 11.

The bit lines are charged by, for example, a constant current. This is done for suppressing a peak current generated in a programming.

The timing when level detection circuit 17 outputs detection signal Vdet (for example, high), that is, the timing when a charge of all the bit lines is completed is different (variable) for the initial and final stages of a programming like the nonvolatile semiconductor memory in FIGS. 1 and 2.

That is, when charging all the bit lines by a constant current, as shown in FIG. 11, for example, if a necessary total charge amount is large, the gradient of a variation in potential until all the bit lines are charged to a predetermined potential (for example, power supply potential VDD) is small (waveform A), thereby prolonging charge time tmax. On the contrary, if a necessary total charge amount is small, the gradient of a variation in potential until all the bit lines are charged to a predetermined potential (for example, power supply potential VDD) is large (waveform B), thereby shortening charge time tmin.

It is very difficult to directly detect the potential level of the bit lines. As in the embodiment, however, it is possible to detect the potential level of fixed potential line VPRE using level detection circuit 17, thereby enabling to indirectly detect the potential level of unselected bit lines connected with unselected memory cells.

In a programming, when the potential level of fixed potential line VPRE is larger than reference potential (threshold) VREF, the control circuit 18 determines a completion of a charge of all the bit lines in memory cell array 11, and also makes a charge time variable based on the determination result.

To associate a charge of the selected bit lines with that of the unselected bit lines, there is provided potential generation circuit 19, like the nonvolatile semiconductor memory in FIGS. 1 and 2.

As shown in FIG. 19, for example, potential generation circuit 19 generates potential VBLC, and supplies potential VBLC to first FET T1 connected between data latch circuit 14-(j/2) and hookup circuit 15-(j/2).

Potential generation circuit 19 includes second FET T2 whose gate and drain are connected with the gate of first FET T1, constant current source 23 connected between power supply node VX and the drain of second FET T2, and resistance element 24 connected between the source of second FET T2 and fixed potential line VPRE.

Using potential generation circuit 19, it is possible to associate a charge of the selected bit lines with that of the unselected bit lines by changing gate potential VBLC of first FET T1 and second FET T2 according to the potential level of fixed potential line VPRE. Note that the sizes of first FET T1 and the second FET T2 are preferably equal to each other.

Gate potential VBLC of first FET T1 and second FET T2 is represented by VPRE+Vthn+α+(Ibl×Rbl) where VPRE indicates the potential of the fixed potential line VPRE, Vthn indicates a threshold voltage of second FET T2, α indicates the back bias effect of second FET T2, Ibl indicates a constant current, and Rbl indicates the resistance value of resistance element 24.

By associating a charge of the selected bit lines with that of the unselected bit lines using potential generation circuit 19, it is possible to obtain an effect of suppressing a peak current due to a constant current, and also shorten the charge time to decrease the programming time (see FIG. 13 and a description thereof).

The programming operation of the above-described nonvolatile semiconductor memory is the same as that of the nonvolatile semiconductor memory in FIGS. 1 to 13, and a description thereof will be omitted.

According to this embodiment, it is possible to simultaneously suppress a peak current and power consumption in a programming. More specifically, when bit lines are charged by a constant current, and a peak current is suppressed in a programming, the charge time of the bit lines tends to become long. According to this embodiment, since the charge time of bit lines is made variable, it is possible to reduce power consumption while shortening the charge time, which is an issue for a charge method using a constant current.

The embodiment is effective for a NAND flash memory having pages each of which amounts at least 8 Kbytes (the number of memory cells which simultaneously execute a program) and a memory system (SSD and the like) using such a NAND flash memory. The embodiment is also effective for a memory system for simultaneously executing a program for chips such as four or eight chips to improve the program speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:
    a first cell unit including a first memory cell;
    a second cell unit including a second memory cell;
    a first bit line connected to one end of the first cell unit;
    a second bit line connected to one end of the second cell unit;
    a source line connected to the other ends of the first and second cell units;
    a cell-source driver setting the source line on a fixed potential in a programming;
    a data latch circuit temporary storing program data;
    a hookup circuit connecting one of the first and second bit lines to the data latch circuit, and connecting the other one of the first and second bit lines to the source line, in the programming;
    a level detection circuit detecting a potential level of the source line; and
    a control circuit determining a completion of a charge of the first and second bit lines when the potential level of the source line is larger than a threshold value, and making a charge time of the first and second bit lines variable, in the programming.

2. The memory of claim 1,
    wherein the cell-source driver set the source line on the fixed potential by a constant current in the programming.

3. The memory of claim 1,
    wherein the hookup circuit connects one end of the other one of the first and second bit lines to the source line, and the fixed potential is applied to the other one of the first and second bit lines from the other ends of the first and second cell units and the one end of the other one of the first and second bit lines.

4. The memory of claim 1,
    wherein the charge time in a final stage of the programming is shorter than that of a initial stage of the programming.

5. The memory of claim 1,
    wherein the charge of the first and second bit lines is executed in synchronization with each other.

6. The memory of claim 5,
    wherein the first bit line is an unselected bit line, and the second bit line is a selected bit line connected a memory cell in which a writing is completed or is not executed in the programming.

7. The memory of claim 1, further comprising
    a first FET with a gate, a source and a drain, the source and the drain of the first FET connected between the data latch circuit and the hookup circuit; and
    a potential generation circuit applying a potential to the gate of the first FET,
    wherein the potential generation circuit comprises:
    a second FET with a gate, a source and a drain, the gate and the drain of the second FET connected to the gate of the first FET;
    a constant current source connected to the drain of the second FET; and
    a resistance element connected between the source of the second FET and the source line.

8. The memory of claim 1,
    wherein the hookup circuit comprises low voltage type FETs which are provided in a well region provided the first and second memory cells,
    a size of each of the data latch circuit and the hookup circuit is larger than that of the low voltage type FETs, and
    the data latch circuit and the hookup circuit are connected by a high voltage type FET which has a breakdown voltage higher than that of the low voltage type FETs.

9. The memory of claim 1,
    wherein each of the first and second memory cells is a 2-level cell which stores 1 bit data.

10. The memory of claim 1,
    wherein each of the first and second memory cells is a 4-level cell which stores 2 bit data.

11. The memory of claim 1,
    wherein each of the first and second cell units is a NAND cell unit which comprises memory cells connected in series.

* * * * *